United States Patent
Tai et al.

(10) Patent No.: US 11,855,142 B2
(45) Date of Patent: Dec. 26, 2023

(54) SUPPORTIVE LAYER IN SOURCE/DRAINS OF FINFET DEVICES

(71) Applicant: Taiwan Semiconductor Manufacturing Co., Ltd., Hsinchu (TW)

(72) Inventors: Jung-Chi Tai, Tainan (TW); Chii-Horng Li, Zhubei (TW); Pei-Ren Jeng, Chu-Bei (TW); Yen-Ru Lee, Hsinchu (TW); Yan-Ting Lin, Baoshan Township (TW); Chih-Yun Chin, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/872,448

(22) Filed: Jul. 25, 2022

(65) Prior Publication Data

US 2022/0367630 A1    Nov. 17, 2022

Related U.S. Application Data

(60) Continuation of application No. 17/107,280, filed on Nov. 30, 2020, now Pat. No. 11,476,331, which is a division of application No. 15/952,495, filed on Apr. 13, 2018, now Pat. No. 10,854,715.

(51) Int. Cl.
| | |
|---|---|
| *H01L 29/08* | (2006.01) |
| *H01L 29/66* | (2006.01) |
| *H01L 29/78* | (2006.01) |
| *H01L 21/02* | (2006.01) |
| *H01L 29/165* | (2006.01) |
| *H01L 21/762* | (2006.01) |

(52) U.S. Cl.
CPC .... *H01L 29/0843* (2013.01); *H01L 21/02532* (2013.01); *H01L 21/76224* (2013.01); *H01L 29/165* (2013.01); *H01L 29/66545* (2013.01); *H01L 29/66795* (2013.01); *H01L 29/7848* (2013.01); *H01L 29/7853* (2013.01)

(58) Field of Classification Search
CPC .......... H01L 29/0843; H01L 21/02532; H01L 21/76224; H01L 29/165; H01L 29/66545; H01L 29/66795; H01L 29/7848; H01L 29/7853
USPC .......................... 257/190, 192, 254, 350, 288
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |

(Continued)

*Primary Examiner* — Bo Fan
(74) *Attorney, Agent, or Firm* — Slater Matsil, LLP

(57) ABSTRACT

An embodiment is a semiconductor structure. The semiconductor structure includes a fin on a substrate. A gate structure is over the fin. A source/drain is in the fin proximate the gate structure. The source/drain includes a bottom layer, a supportive layer over the bottom layer, and a top layer over the supportive layer. The supportive layer has a different property than the bottom layer and the top layer, such as a different material, a different natural lattice constant, a different dopant concentration, and/or a different alloy percent content.

20 Claims, 11 Drawing Sheets

(56) References Cited

U.S. PATENT DOCUMENTS

| | | |
|---|---|---|
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2005/0104096 A1 | 5/2005 | Hyung et al. |
| 2013/0026538 A1* | 1/2013 | Liao .................... H01L 29/7848 257/190 |
| 2014/0214492 A1* | 7/2014 | Bergerson .............. G06Q 40/06 705/7.35 |
| 2014/0217508 A1 | 8/2014 | Chang et al. |
| 2014/0252475 A1 | 9/2014 | Xu |
| 2014/0264492 A1 | 9/2014 | Lee |
| 2015/0091099 A1 | 4/2015 | Ching et al. |
| 2015/0287810 A1* | 10/2015 | Kerber ................ H01L 29/1054 257/192 |
| 2016/0293749 A1 | 10/2016 | Park et al. |
| 2016/0359012 A1 | 12/2016 | Yu et al. |
| 2017/0154990 A1 | 6/2017 | Sung et al. |

\* cited by examiner

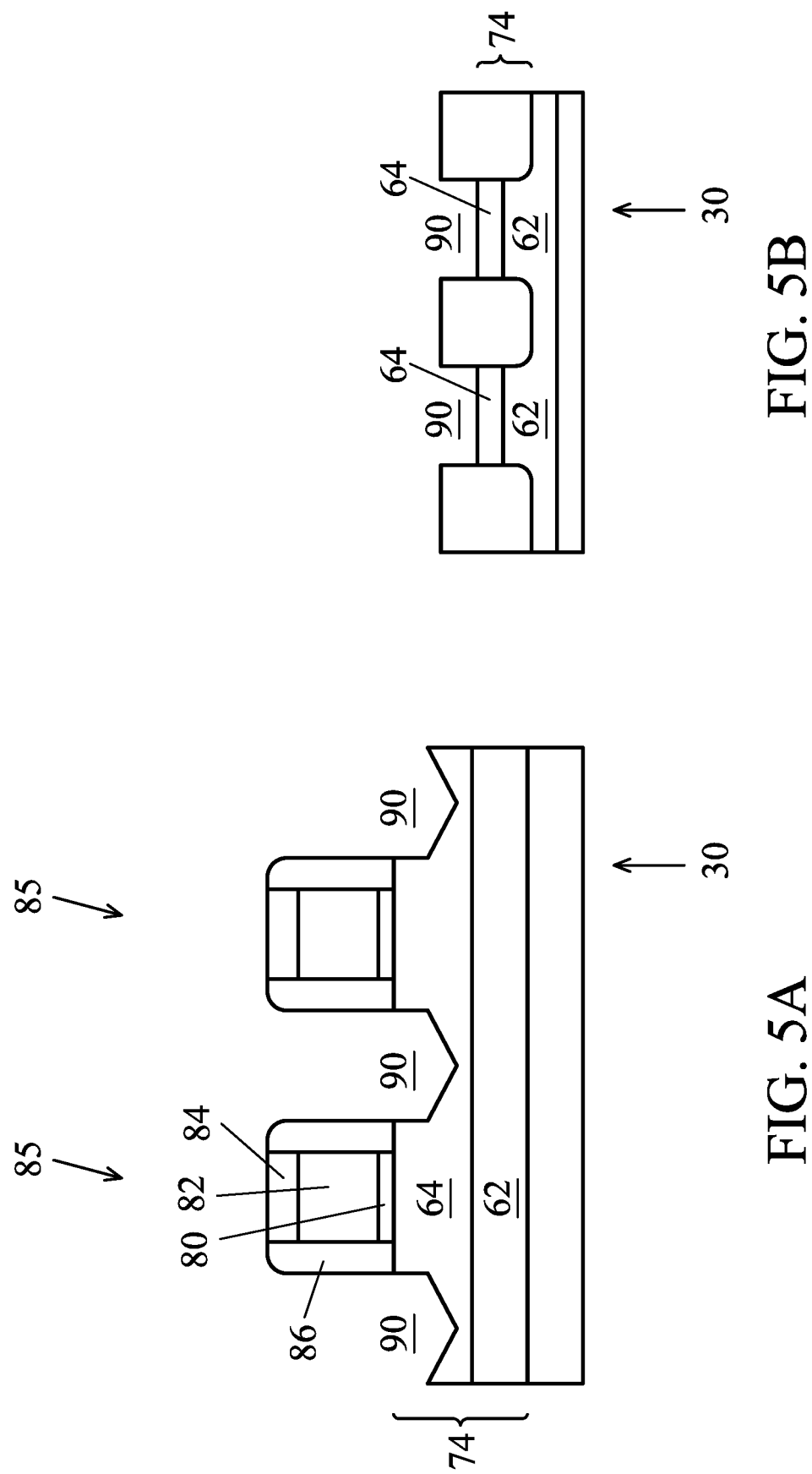

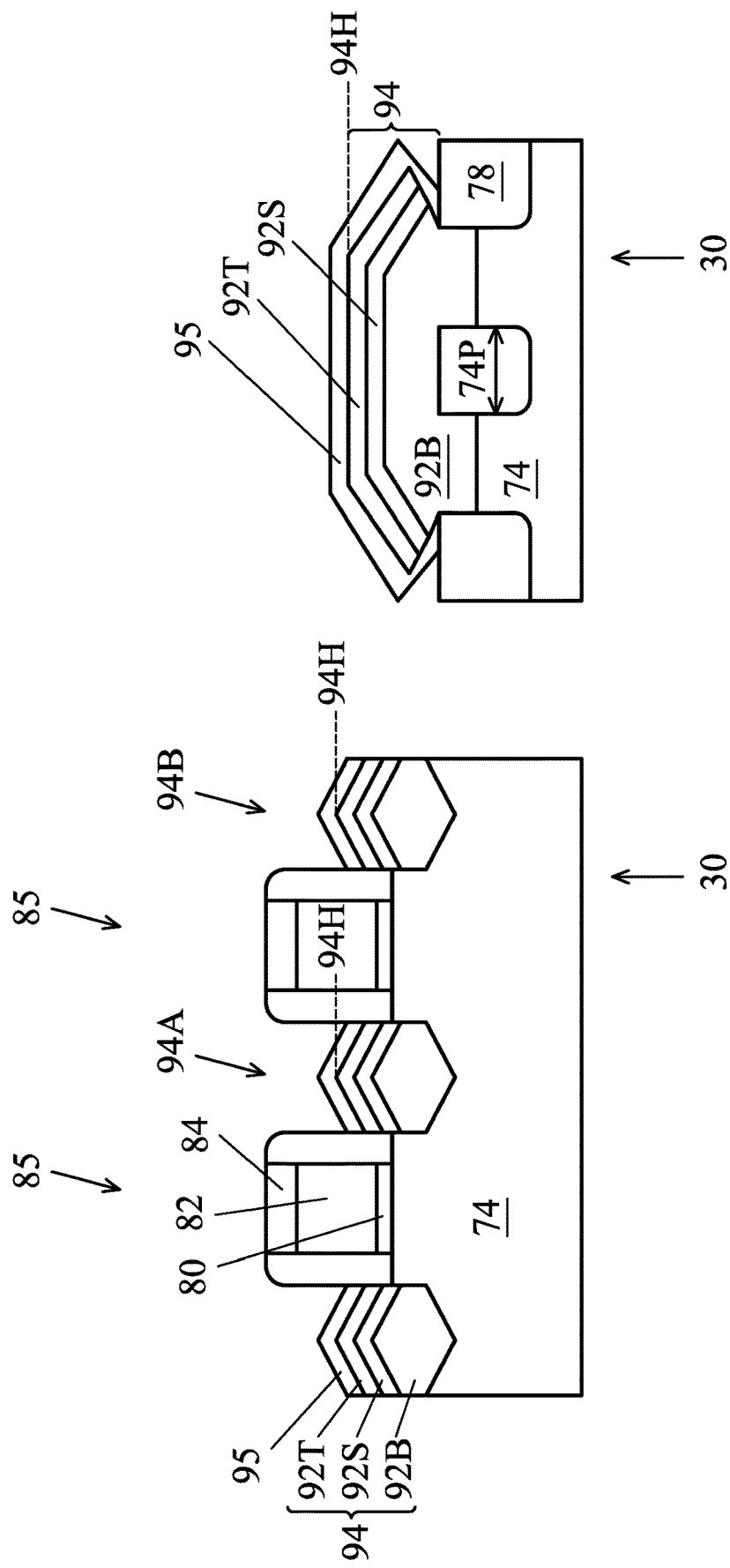

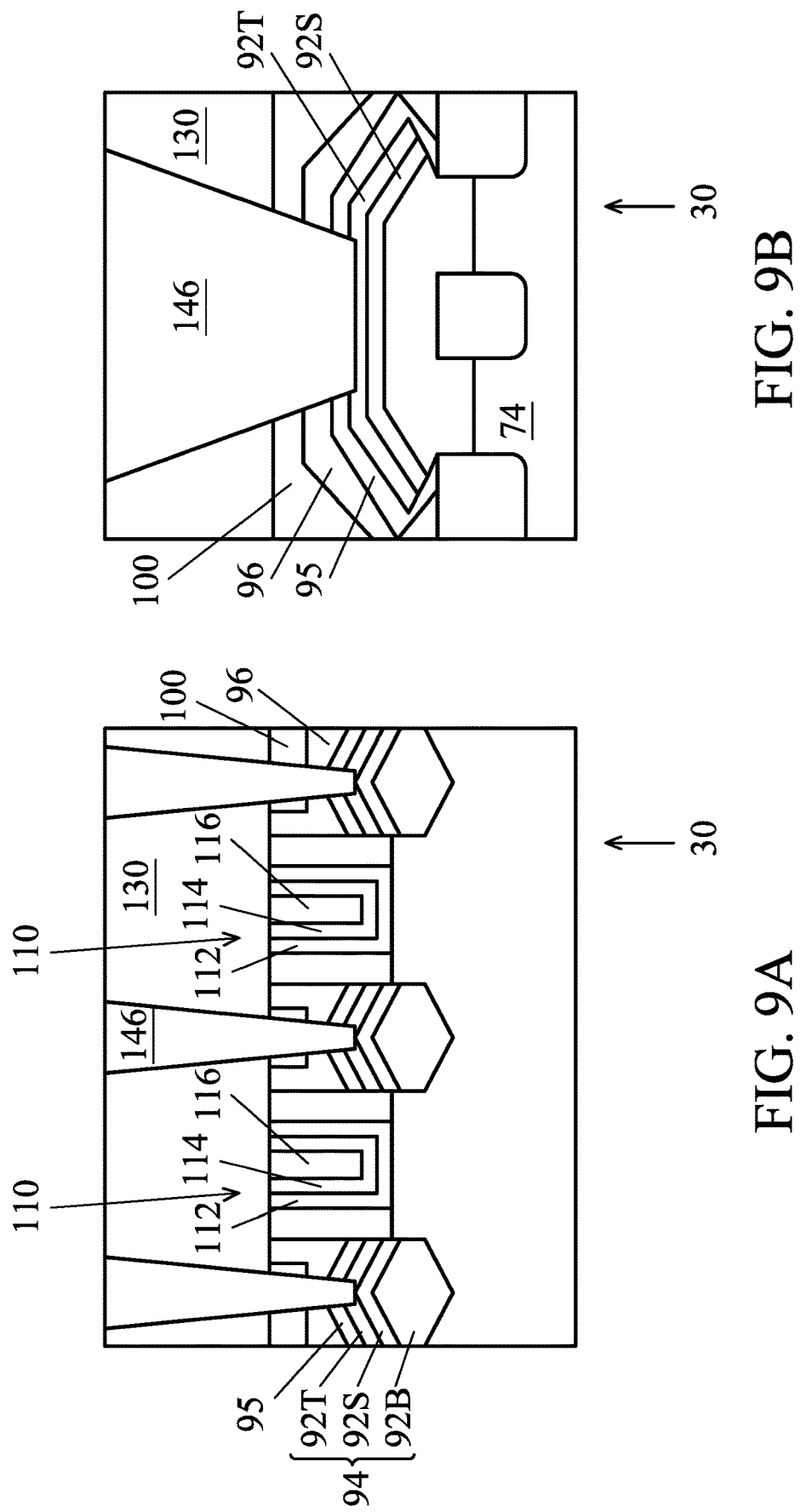

SUPPORTIVE LAYER IN SOURCE/DRAINS OF FINFET DEVICES

CROSS-REFERENCE TO RELATED APPLICATIONS

This application is a continuation of U.S. application Ser. No. 17/107,280, filed Nov. 30, 2020, which is a divisional of U.S. application Ser. No. 15/952,495, filed on Apr. 13, 2018, now U.S. Pat. No. 10,854,715, filed Dec. 1, 2020, which applications are hereby incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scale, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3B, 4A-4B, 5A-5B, 6A-6B, 7A-7B, 8A-8B, and 9A-9B illustrate cross-sectional views of respective intermediate structures of a semiconductor device at intermediate stages of manufacturing the semiconductor device, in accordance with some embodiments.

DETAILED DESCRIPTION

Figure 1:
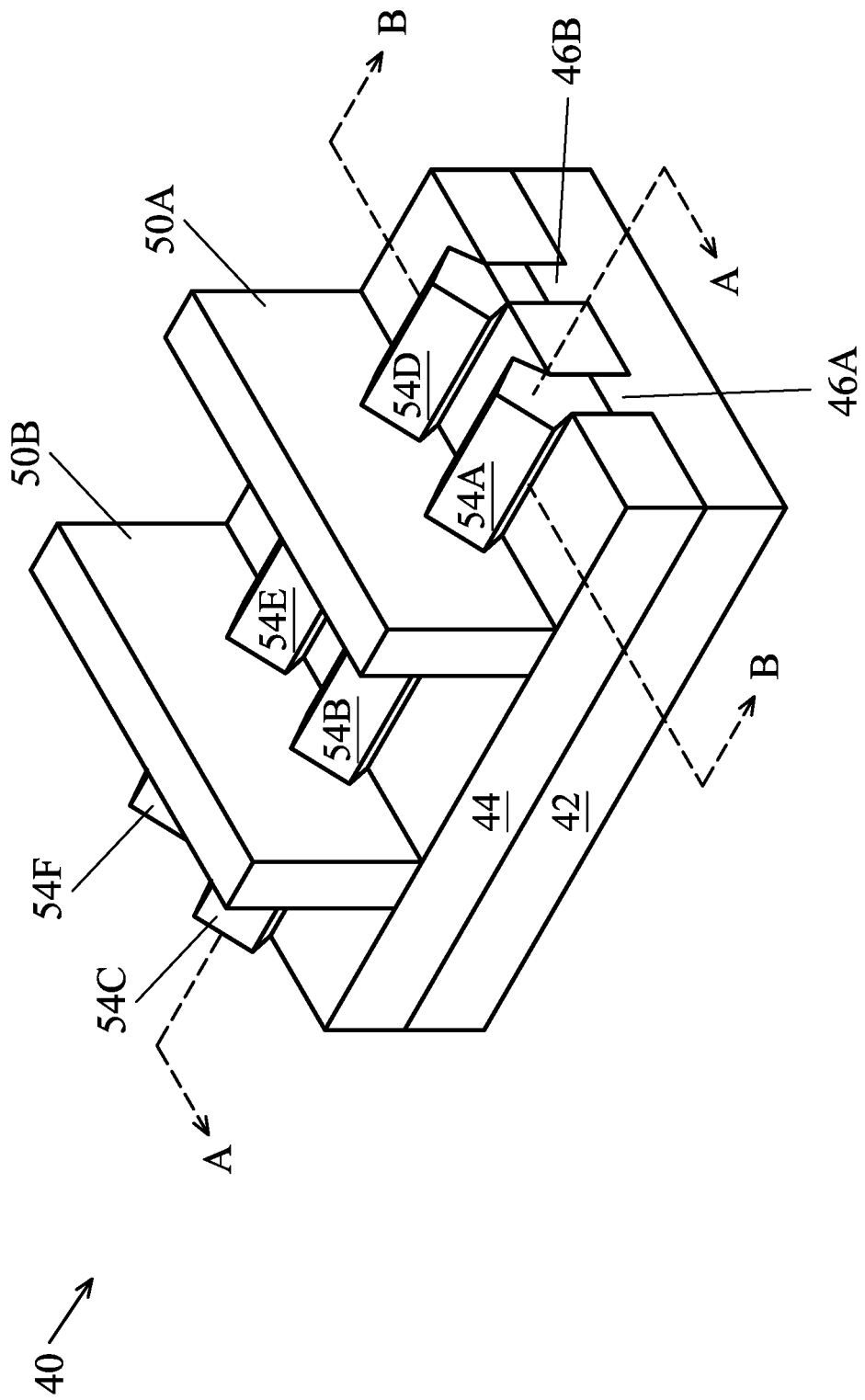
FIG. 1 is a three-dimensional view of an example of simplified Fin Field Effect Transistors (FinFETs), in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein relate generally to forming one or more supportive layers within source/drains on a fin of a FinFET device. For example, the fin may have recesses formed therein in which the source/drains are formed. In certain embodiments, the supportive layer may help to enhance epitaxial growth of the source/drains. In certain embodiments, the supportive layer may help to control the uniformity and the shape of the source/drains. In certain embodiments, the supportive layer may help to provide larger strain transfer by the source/drains to a channel formed by the fin of a FinFET device.

The foregoing broadly outlines some aspects of embodiments described herein. Some embodiments described herein are described in the context of Fin Field Effect Transistors (FinFETs). Some embodiments are described herein in the context of a replacement gate process. Implementations of some aspects may be used in other processes and/or in other devices. For example, other example processes can include a gate-first process, and other example devices include Horizontal Gate All Around (HGAA) FETs, Vertical Gate All Around (VGAA) FETs, nanowire channel FETs, and other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIG. 1 illustrates an example of simplified FinFETs 40 in a three-dimensional view, in accordance with some embodiments. Other aspects not illustrated in or described with respect to FIG. 1 may become apparent from the following figures and description.

The FinFETs 40 comprise fins 46A and 46B formed between isolation regions 44. Gates 50A and 50B are formed over the fins 46A and 46B. Source/drains 54A-F are disposed in or over respective regions of the fins 46A and 46B. As shown, neighboring source/drains 54A-F (e.g., between the fins 46A and 46B, such as source/drain 54A and source/drain 54D) may be unmerged between various transistors. In other embodiments, neighboring source/drains may be electrically connected, such as through coalescing or merging neighboring source/drains (e.g., source/drains 54A and 54D), to form merged source/drain regions. In other configurations, other numbers of functional transistors may be implemented.

FIG. 1 further illustrates reference cross-sections that are used in later figures. Cross-section A-A is in a plane along the fin 46A between opposing source/drain regions 54A-C. Cross-section B-B is in a plane perpendicular to cross-section A-A and is across source/drain 54A in fin 46A and across source/drain 54D in fin 46B. Subsequent figures refer to these reference cross-sections for clarity. The following figures ending with an "A" designation illustrate cross-sectional views at various instances of processing corresponding to cross-section A-A, and the following figures ending with a "B" designation illustrate cross-sectional views at various instances of processing corresponding to cross-section B-B. In some figures, some reference numbers of components or features illustrated therein may be omitted to avoid obscuring other components or features for ease of description.

Figure 2:
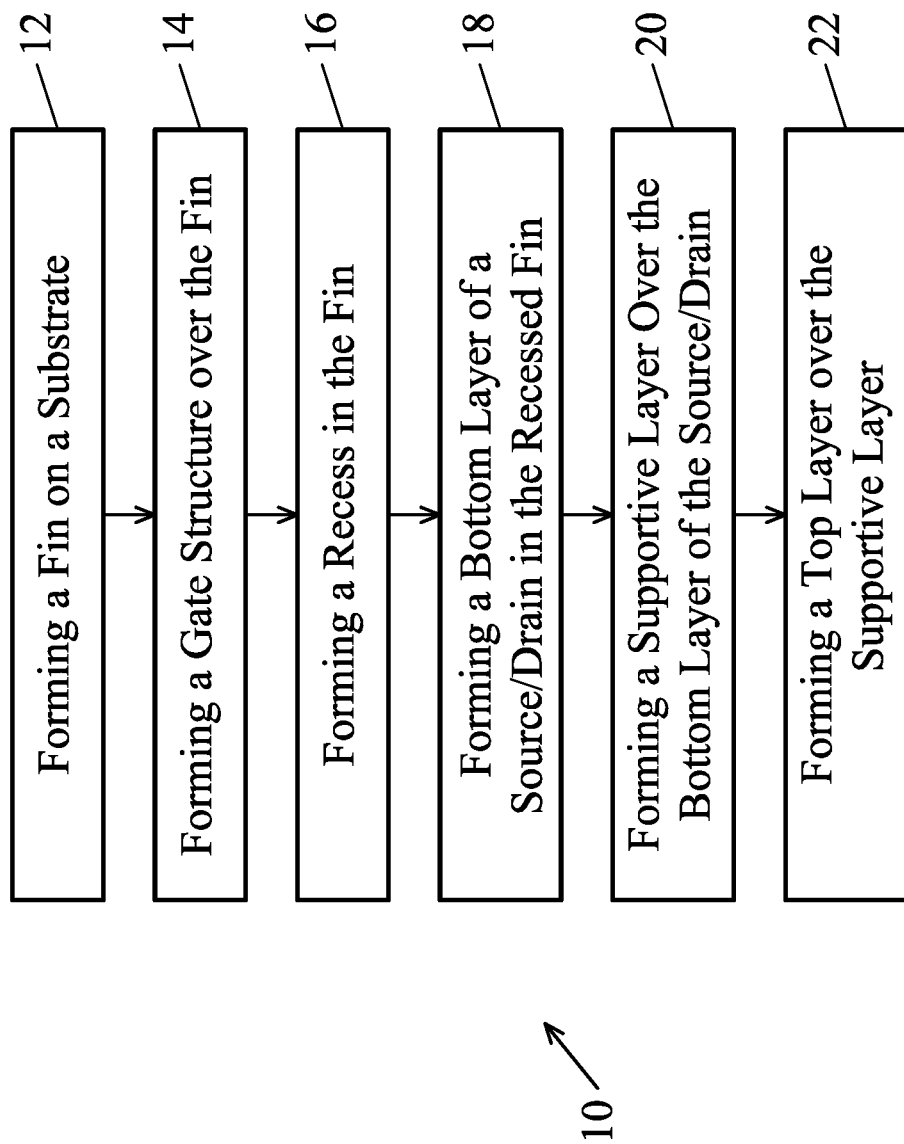
FIG. 2 is a flow diagram illustrating a method of manufacturing a semiconductor device, such as a FinFET structure, over a substrate, in accordance with some embodiments.

FIG. 2 is a flow diagram illustrating a method 10 of manufacturing a semiconductor device, such as a FinFET structure, in accordance with some embodiments. The method 10 is described in reference to FIGS. 3A-B to FIGS. 9A-B. FIGS. 3A-B through 9A-B are cross-sectional views of respective intermediate semiconductor structures at intermediate stages in an example process of forming a semiconductor device 30, in accordance with some embodiments.

Figure 3B:
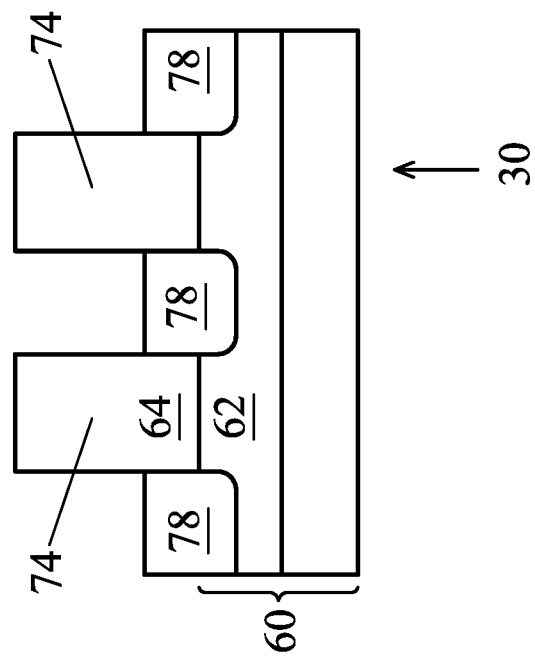
Figure 3A:
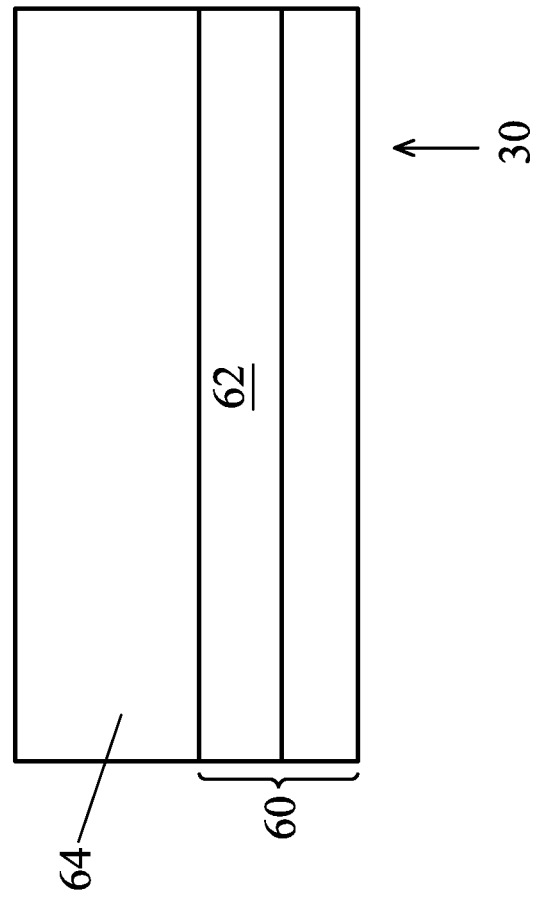

FIGS. 3A and 3B illustrate a semiconductor substrate 60 having fins 74, in accordance with some embodiments. The semiconductor substrate 60 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 60 may include an elemental semiconductor like silicon (Si) or germanium (Ge); a compound semiconductor; an alloy semiconductor; or a combination thereof.

In the embodiments shown in FIGS. 3A and 3B, the semiconductor substrate 60 may be a p-type silicon wafer having an area implanted or doped with an n-type dopant to form an n-well 62. A concentration of the n-type dopant in the n-well 62 can be in a range from about $5 \times 10^{16}$ cm$^{-3}$ to about $1 \times 10^{19}$ cm$^{-3}$. In certain embodiments, an epitaxial layer 64 may be deposited by epitaxial growth over the n-well 62. In certain embodiments, the epitaxial layer 64 is a SiGe ($Si_xGe_{1-x}$) layer having a germanium atomic percent content in a range from about 5% to about 30%. The epitaxial layer 64 may also comprise a gradient layer with a content of an element (e.g., germanium) that varies along the depth of the epitaxial layer 64. Deposition methods for depositing the epitaxial layer 64 include chemical vapor deposition (CVD), low pressure CVD (LPCVD), atomic layer CVD (ALCVD), ultrahigh vacuum CVD (UHVCVD), reduced pressure CVD (RPCVD), vapor-phase epitaxy (VPE), molecular beam epitaxy (MBE), any other suitable deposition processes, or any combination thereof.

At block 12 of the method 10, the fins 74 are formed in the epitaxial layer 64 and the semiconductor substrate 60. The fins 74 can be formed by etching trenches through the epitaxial layer 64 into the semiconductor substrate 60 using appropriate photolithography and etching processes, for example. Isolation regions 78 are formed, each in a corresponding trench. The isolation regions 78 may include or be an insulating material such as an oxide (such as silicon oxide), a nitride, the like, or a combination thereof. The insulating material may be deposited by any acceptable deposition process and recessed using an acceptable etch process to form the isolation regions 78. The fins 74 protrude from between neighboring isolation regions 78, which may, at least in part, thereby delineate the fins 74 as active areas on the semiconductor substrate 60.

In some embodiments, the epitaxial layer 64 can be omitted. In such embodiments, the fins 74 can be formed by etching the trenches into the semiconductor substrate 60, similar to what was described previously. Hence, the fins 74 can be the same material as the semiconductor substrate. In certain embodiments, the semiconductor substrate 60 is a silicon wafer, and the fins 74 are also silicon. Fins 74 are generally depicted in some of the subsequent figures, which can include or omit the epitaxial layer 64.

A person having ordinary skill in the art will readily understand that the process described above is just an example of how fins 74 may be formed. In other embodiments, a dielectric layer can be formed over a top surface of the semiconductor substrate 60; trenches can be etched through the dielectric layer; epitaxial structures (e.g., homoepitaxial or heteroepitaxial structures) can be epitaxially grown in the trenches; and the dielectric layer can be recessed such that the epitaxial structures protrude from the dielectric layer to form fins. Fins formed by these processes can have a general structure similar to what is shown in the figures.

Figures 4A, 4B:
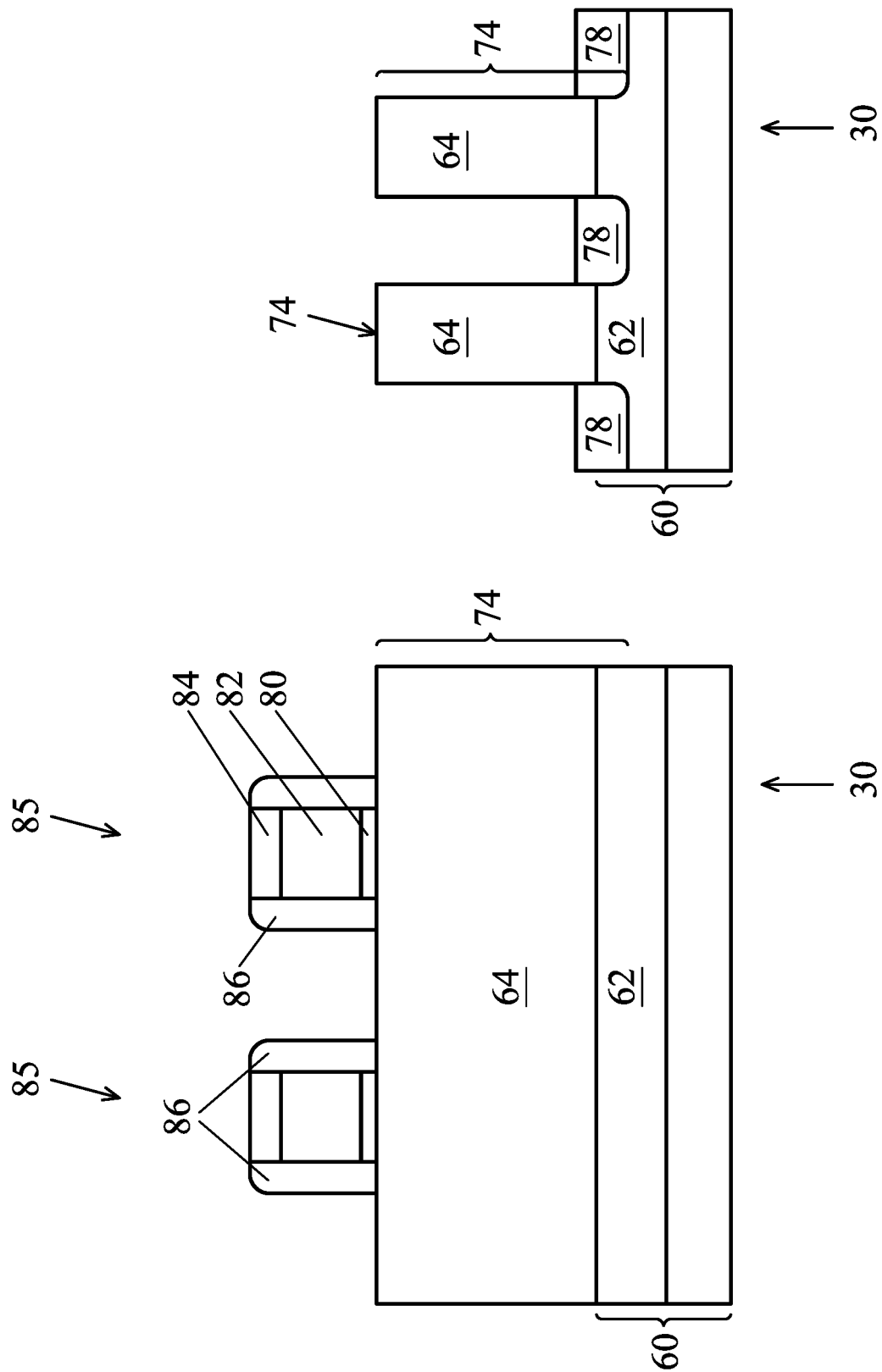

At block 14 of the method 10, dummy gate structures 85 are formed over the fins 74, as shown in FIGS. 4A and 4B. The dummy gate structures 85 are over and extend laterally perpendicularly to the fins 74. Each dummy gate structure 85 comprises a dielectric layer 80, a dummy gate layer 82, and a mask 84. The dielectric layer 80, dummy gate layer 82, and mask 84 for the dummy gate structures 85 may be formed by sequentially forming respective layers, such as by appropriate deposition processes, and then patterning those layers into the dummy gate structures 85, such as by appropriate photolithography and etching processes. For example, the dielectric layer 80 may include or be silicon oxide, silicon nitride, the like, or multilayers thereof. The dummy gate layer 82 may include or be silicon (e.g., polysilicon) or another material. The mask 84 may include or be silicon nitride, silicon oxynitride, silicon carbon nitride, the like, or a combination thereof.

In some embodiments, after forming the dummy gate structures 85, lightly doped drain (LDD) regions (not specifically illustrated) may be formed in the fins 74. For example, dopants may be implanted into the fins 74 using the dummy gate structures 85 as masks. Example dopants for the LDD regions can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

FIGS. 4A and 4B further illustrate the formation of gate spacers 86 along sidewalls of the dummy gate structures 85 (e.g., sidewalls of the dielectric layer 80, the dummy gate layer 82, and the mask 84) and over the fins 74. The gate spacers 86 may be formed by conformally depositing one or more layers for the gate spacers 86, such as by an appropriate deposition process, and aniostropically etching, such as by an appropriate etching process, the one or more layers to form the gate spacers 86. The gate spacers 86 may include or be silicon nitride, silicon oxynitride, silicon carbon nitride, the like, multi-layers thereof, or a combination thereof.

At block 16 of the method 10, recesses 90 are formed in the fins 74, as shown in FIGS. 5A and 5B. As illustrated, the recesses 90 are formed in the fins 74 on opposing sides of the dummy gate structures 85. The recesses 90 can be formed by an etch process. The etch process can be isotropic or anisotropic, or further, may be selective with respect to one or more crystalline planes of the semiconductor substrate 60 and/or epitaxial layer 64. Hence, the recesses 90 can have various cross-sectional profiles based on the etch process implemented. The etch process may be a dry etch, such as a reactive ion etch (RIE), neutral beam etch (NBE), or the like, or a wet etch, such as using tetramethyalammonium hydroxide (TMAH), ammonium hydroxide (NH$_4$OH), or another etchant.

Blocks 18, 20, and 22 include the formation of various layers for a source/drain. Specific examples provided in the context of FIGS. 6A-6B through 8A-8B are described with the various layers being or comprising silicon or silicon germanium to illustrate aspects of various embodiments. A person having ordinary skill in the art will readily understand that the various layers can be or include other materials consistent with this disclosure.

Figure 6A:
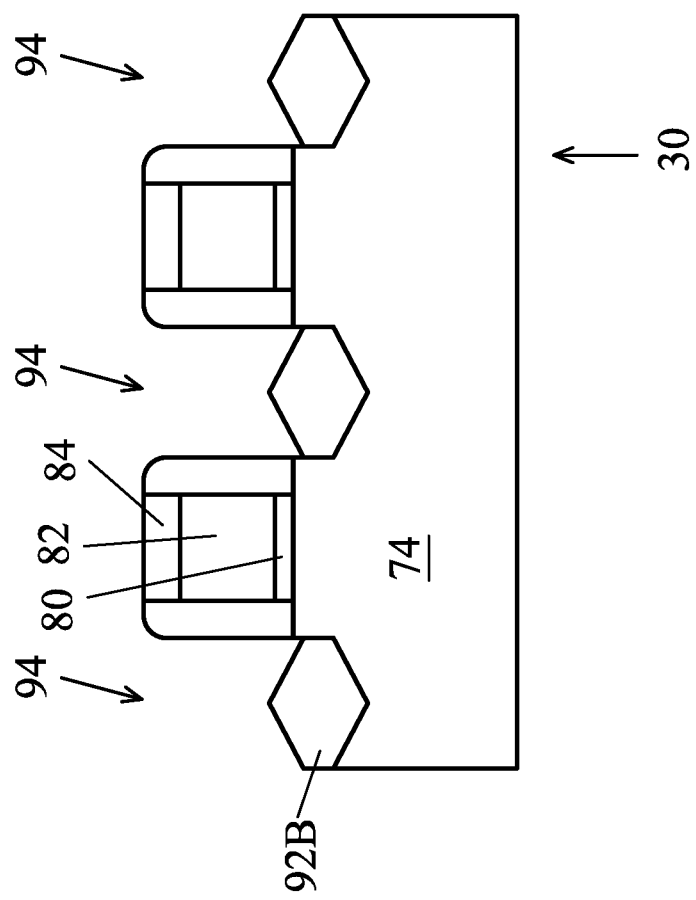
Figure 6B:
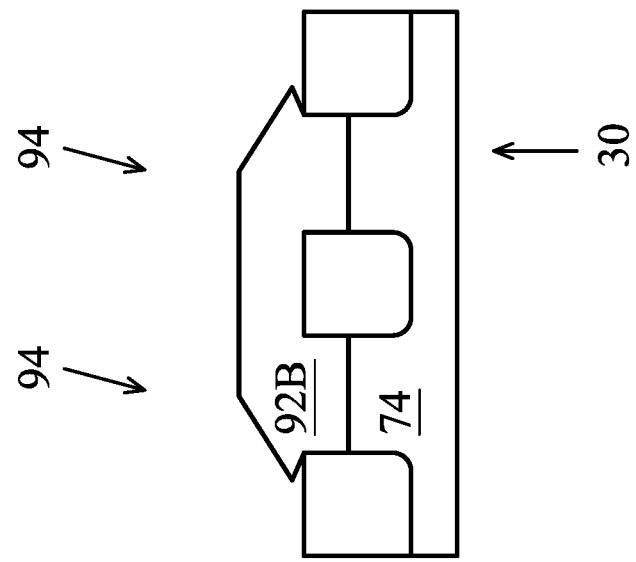

At block 18 of the method 10, a bottom layer 92B of the source/drains 94 is formed in the recesses 90, as shown in FIGS. 6A and 6B. The bottom layer 92B of the source/drains 94 may include or be silicon germanium ($Si_xGe_{1-x}$, where x can be in a range from approximately 0 to 1). The bottom layer 92B of the source/drains may be formed in the recesses 90 by epitaxially growing a material in the recesses 90, such as by RPCVD, LPCVD, metal-organic CVD (MOCVD), molecular beam epitaxy (MBE), liquid phase epitaxy (LPE), vapor phase epitaxy (VPE), selective epitaxial growth (SEG), the like, or a combination thereof. In some examples, the bottom layer 92B of the source/drains may also be doped, such as by in situ doping during epitaxial growth and/or by implanting dopants into the bottom layer 92B after epitaxial growth. Example dopants for the source/drains can include or be, for example, boron for a p-type device and phosphorus or arsenic for an n-type device, although other dopants may be used. The epitaxy source/drains 94 (or other source/drain region) may have a dopant concentration in a range from about $10^{19}$ cm$^{-3}$ to about $10^{21}$ cm$^{-3}$.

Figure 7A:
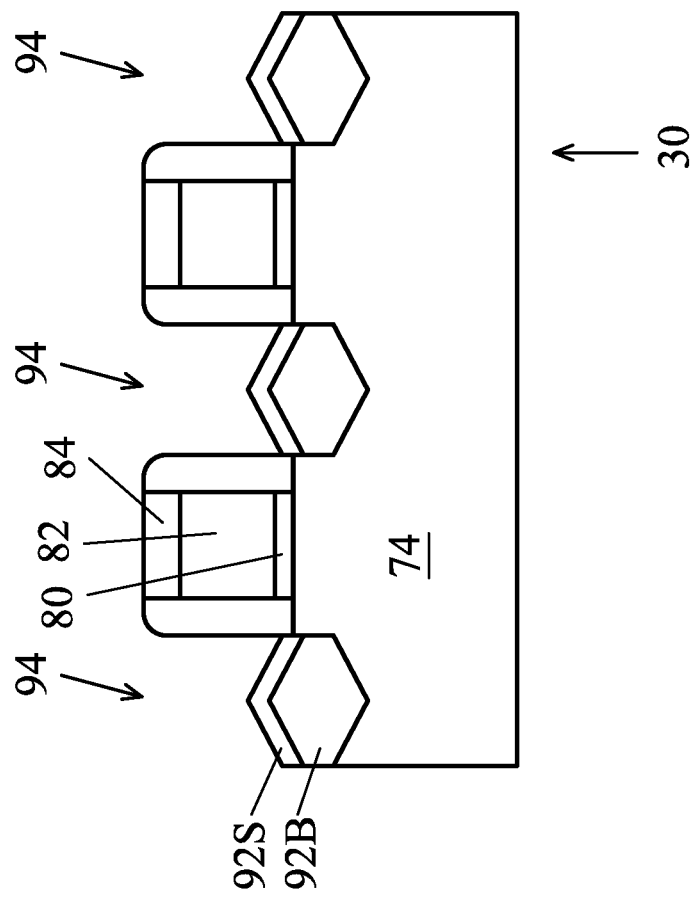
Figure 7B:
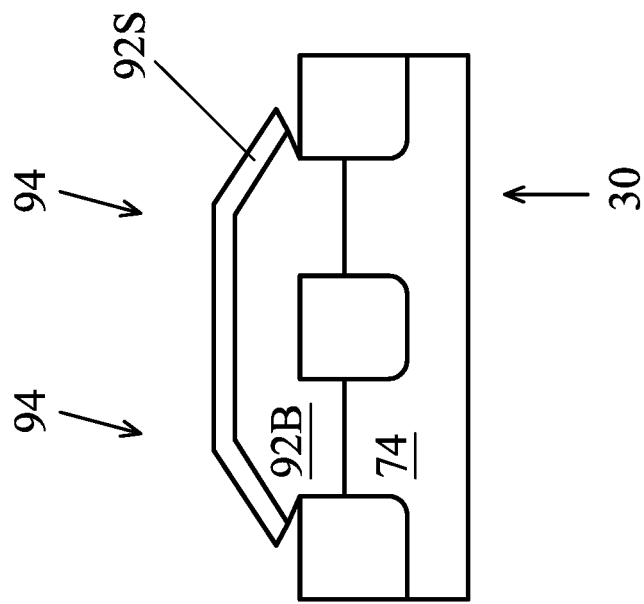

At block 20 of the method 10, a supportive layer 92S of the source/drains 94 is formed over the bottom layer 92B of the source/drains 94, as shown in FIGS. 7A and 7B. The supportive layer 92S may include or be silicon, silicon germanium (SiGe), boron doped silicon germanium (SiGe:B), phosphorus doped silicon (Si:P), phosphorus doped silicon germanium (SiGe:P), arsenic doped silicon (Si:As), arsenic doped silicon germanium (SiGe:As), the like, or a combination thereof. In some embodiments, the supportive layer 92S comprises SiGe with a germanium atomic percent content in a range from 1% to 50%. The supportive layer 92S of the source/drains 94 may be formed over the bottom layer 92B and/or in the recesses 90 by epitaxially growing a material on the bottom layer 92B, such as by RPCVD, LPCVD, MOCVD, MBE, LPE, VPE, SEG, the like, or a combination thereof. In certain embodiments, the supportive layer 92S is deposited to a thickness T in a range from about 0.5 nm to about 10 nm. In certain embodiments, the supportive layer 92S is deposited to a thickness T in a range from about 0.5 nm to about 4 nm while the thickness of the bottom layer 92B is in a range from about 30 nm to about 50 nm.

In some examples, the supportive layer 92S of the source/drains 94 may be doped, such as by in situ doping during epitaxial growth and/or by implanting dopants into the supportive layer 92S. In some embodiments, the supportive layer 92S comprises SiGe:B with a boron centration in a range from about $5\times10^{19}$ cm$^{-3}$ to about $1\times10^{21}$ cm$^{-3}$. In other embodiments, the supportive layer 92S comprises SiGe:P with a phosphorus concentration in a range from about $5\times10^{19}$ cm$^{-3}$ to about $1\times10^{21}$ cm$^{-3}$.

At block 22 of the method 10, a top layer 92T of the source/drains 94 is formed over the supportive layer 92S, as shown in FIGS. 8A and 8B. The top layer 92T of the source/drains 94 may include or be silicon germanium ($Si_xGe_{1-x}$, where x can be in a range from approximately 0 and 1). The top layer 92T of the source/drains 94 may be formed over the supportive layer 92S by epitaxial growth, such as by RPCVD, LPCVD, MOCVD, MBE, LPE, VPE, SEG, the like, or a combination thereof.

In some examples, the top layer 92T of the source/drains 94 may also be doped, such as by in situ doping during epitaxial growth and/or by implanting dopants into the top layer 92T after epitaxial growth. Example dopants for the source/drains can include or be, for example, boron for a p-type device and phosphorus or arsenic for an n-type device, although other dopants may be used. The top layer 92T of the source/drains (or other source/drain region) may have a dopant concentration in a range from about $10^{19}$ cm$^{-3}$ to about $10^{21}$ cm$^{-3}$.

An optional capping layer 95 may be deposited over the top layer 92T of the source/drains 94, as also shown in FIGS. 8A and 8B. The capping layer 95 may comprise Si or other suitable materials. In certain embodiments, the capping layer 95 helps protect the underlying source/drains 94 from environmental effects, such as oxidation and humidity. The capping layer 95 may also be used to form better ohmic contact with a metal used to make electrical contact with the source/drains 94. In certain embodiments, the capping material helps to protect the underlying materials, such as source/drains 94 comprised of silicon germanium from outgassing germanium.

In certain embodiments, the bottom layer 92B of the source/drains 94 comprises silicon germanium having a first germanium atomic percent content, and the top layer 92T of the source/drains 94 comprises silicon germanium having a second germanium atomic percent content greater than the first germanium atomic percent content. In other words, the top layer 92T has a higher germanium atomic percent content that than the bottom layer 92B. The top layer 92T having a higher atomic percent content than the bottom layer 92B can help induce strain in the channels defined by the gate structures over the fin 74.

The supportive layer 92S may help to reduce the lattice-mismatch of the bottom layer 92B and the top layer 92T. Reduced lattice-mismatch may help to provide higher strain transfer to the channel. In certain embodiments, the recessed fin 74 (e.g., the epitaxial layer 64) comprises silicon germanium having a germanium atomic percent content lower than the germanium atomic percent content of the bottom layer 92B. The supportive layer 92S, in some examples, has a germanium atomic percent content greater than the germanium atomic percent content of the fin 74 (e.g., the epitaxial layer 64), and lower than the germanium atomic percent content of each of the bottom layer 92B and the top layer 92T.

In certain embodiments, the supportive layer 92S has one or more different properties than the bottom layer 92B and the top layer 92T of the source/drains 94, such as a different material, a different natural lattice constant, a different dopant concentration, and/or a different alloy percent content.

In one example of a different material, the supportive layer 92S comprises boron doped silicon, undoped silicon, or undoped silicon germanium while the bottom layer 92B and the top layer 92T both comprise boron doped silicon germanium. In another example, the supportive layer 92S comprises arsenic doped silicon, arsenic doped silicon germanium, undoped silicon, or undoped silicon germanium while the bottom layer 92B and the top layer 92T both comprise phosphorus doped silicon. In still other example, the supportive layer 92S comprises phosphorus doped silicon, phosphorus doped silicon germanium, undoped silicon, undoped silicon germanium while the bottom layer 92B and the top layer 92T both comprise arsenic doped silicon.

In one example of a different natural, relaxed lattice constant, the supportive layer 92S comprises a p-doped silicon germanium having a different natural, relaxed lattice constant than the bottom layer 92B and the top layer 92T both comprising a p-doped silicon germanium.

In one example of a different dopant concentration, the supportive layer 92S comprises p-doped silicon germanium having a lower p-dopant concentration than the bottom layer 92B and the top layer 92T both comprising p-doped silicon germanium.

In one example of a different alloy percent content, the bottom layer 92B, the supportive layer 92S, and the top layer 92T all comprise doped SiGe in which the supportive layer 92S comprises a germanium atomic percent content less than the bottom layer 92B and less than the top layer 92T. In another example of a different alloy percent content, the bottom layer 92B, the supportive layer 92S, and the top layer 92T all comprise doped SiGe in which the supportive layer 92S comprises a germanium atomic percent content less than the bottom layer 92B and in which the bottom layer 92B comprises a germanium atomic percent content less than the top layer 92T.

In certain embodiments, the supportive layer 92S of the source/drains 94 helps to enable a more uniform height 94H of the source/drains 94 (e.g., reduced height variation of the source/drains 94). In certain embodiments, the height 94H of the source/drains is in a range from about 50 nm to about 100 nm. For example, the height 94H of a first source/drain region 94A and the height 94H of a second source/drain region 94B are substantially uniform. The term height 94H of the source/drain region 94 is defined as the highest point of the top surface of the source/drain 94. In certain embodiments, the variation of the height 94H between the first source/drain region 94A and the second source/drain region 94B is less than about 1 nm.

In certain embodiments, the thickness of the bottom layer 92B is in a range from about 30 nm to about 50 nm. In certain embodiments, the thickness of the supportive layer 92S is in a range from about 0.5 nm to about 4 nm. In certain embodiments, the thickness of the top layer 92T is in a range from about 15 nm to about 45 nm. In certain embodiments, the ratio of the thickness of the bottom layer 92B to the supportive layer 92S is in a range from about 10:1 to about 100:1. In certain embodiments, the ratio of the thickness of the supportive layer 92S to the top layer 92T is in a range from about 1:10 to about 1:100. In certain embodiments, the pitch 74P between neighboring fins is in a range from about 20 nm to about 50 nm.

In certain embodiments, the supportive layer 92S having a thickness of in a range from about 0.5 nm and about 4 nm is able to provide less lattice dislocations from the top layer 92T to the bottom layer 92B in comparison to a top layer 92T directly formed on the bottom layer 92B. Although the supportive layer 92S has a different lattice constant that the bottom layer 92B, the supportive layer 92S epitaxially grows over the bottom layer 92B with less lattice dislocations and provides a low defect surface for epitaxial growth of the top layer 92T. Since there are less lattice dislocations, greater strain can be transferred from the top layer 92T through the supportive layer 92S to the bottom layer 92B to the fin 74 to form a strain channel device with greater strain transfer to the channel. If the supportive layer 92S has a thickness of less than about 0.5 nm, the supportive layer 92S may incompletely cover the bottom layer 92B. If the supportive layer 92S has a thickness of about 5 nm or more, the lattice of the supportive layer 92S may not be able to conform to both the lattice of the bottom layer 92B and the lattice of the top layer 92T and which would cause the top layer 92T grown over the supportive layer 92S to have greater lattice dislocations.

In some examples, wherein the source/drains 94 are desired to have conformal/oval profiles, a relatively Ge rich material may be selected for the supportive layer 92S. In other examples wherein the source/drains 94 are desired to have facet profiles, a relatively silicon rich material may be selected for the supportive layers 92S. The shapes of the source/drains 94 at certain locations may also be tunable and adjustable by adding additional layers with different materials to assist growing the source/drains 94 at different crystalline planes and orientations at different growing stages of the source/drains 94. Thus, by forming the supportive layer 92S between the top layer 92T and the bottom layer 92B (e.g., having at least different atomic ratios of the elements formed in the layers 92S, 92T, 92B), different crystalline planes, shapes, lattice structures, and structure density may be tuned and obtained for the source/drains 94, thus enhancing electrical performance of the semiconductor devices.

As illustrated in FIGS. 6A-6B through 8A-8B, due to blocking by the isolation regions 78, epitaxy source/drains 94 are first grown vertically in the recesses 90, during which time the epitaxy source/drains 94 do not grow horizontally. After the recesses 90 are fully filled, the source/drains 94 may grow both vertically and horizontally to form facets, which may correspond to crystalline planes of the semiconductor substrate 60. In other embodiments, the source/drains 94 may grow conformally or uni-directionally rather than by facet growth.

In certain embodiments, two or more (e.g., all) of the bottom layer 92B, the supportive layer 92S, the top layer 92T, and the capping layer 95 may be formed in the same chamber. For example, the ratio of a flow of silicon precursor to germanium precursor may be varied to form a bottom layer 92B comprising SiGe having a first germanium atomic percent content, a supportive layer 92S, a top layer 92T comprising SiGe having a second germanium atomic percent content higher than the first germanium atomic percent content, and a capping layer 96. In certain embodiments, the epitaxial bottom layer 92B, the epitaxial supportive layer 92S, and the epitaxial top layer 92T each are substantially dislocation free.

As stated above, other examples can implement different materials for the bottom layer 92B, supportive layer 92S, and top layer 92T. In examples, the bottom layer 92B, supportive layer 92S, and top layer 92T each may be silicon, silicon germanium, silicon carbide, silicon phosphorus, silicon carbon phosphorus, germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. A person having ordinary skill in the art will readily understand how aspects of the various layers can be applied and implemented with different materials. For example, a person having ordinary skill in the art will readily understand that the SiGe described in the examples above implemented a compressive stress in the source/drains 94 and in the channels, and that other materials or combinations of materials may also or instead be similarly implemented to achieve compressive stresses. Further, other materials or combinations of materials, such as silicon carbide (which may be doped with phosphorus or arsenic, for example), may implement a tensile stress in the source/drains 94 and in the channels.

FIGS. 9A and 9B illustrate an intermediate structure after forming a contact etch stop layer (CESL) 96 and a first interlayer dielectric (ILD) 100 over the CESL 96. Generally, an etch stop layer can provide a mechanism to stop an etch process when forming, e.g., contacts or vias. An etch stop layer may be formed of a dielectric material having a different etch selectivity from adjacent layers or components. The CESL 96 is conformally deposited, such as by an appropriate deposition process, on surfaces of the epitaxy source/drains 94, sidewalls and top surfaces of the gate spacers 86, top surfaces of the mask 84, and top surfaces of the isolation regions 78. The CESL 96 may comprise or be silicon nitride, silicon carbon nitride, silicon carbon oxide, carbon nitride, the like, or a combination thereof. The first ILD 100 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The first ILD 100 may be planarized after being deposited, such as by a CMP, which may remove the masks 84 and expose the dummy gate layers 82 of the dummy gate structures 85.

FIGS. 9A and 9B further illustrate the intermediate structure after replacing the dummy gate structures 85 with respective replacement gate structures 110, forming a second ILD 130, and forming contacts 146. The dummy gate structures 85 are then removed, such as by an appropriate etching process, to form trenches. The trenches are filed with respective replacement gate structures 100. The replacement gate structures 110 each include a conformal gate dielectric layer 112, an optional metal liner layer 114, and a conductive gate fill 116. The conformal gate dielectric layer 112, optional metal liner layer 114, and conductive gate fill 116 can be deposited by appropriate deposition techniques.

The gate dielectric layer 112 is formed conformally in the trench, such as along sidewall and top surfaces of the fin 74 and along sidewalls of the gate spacers 86. The gate dielectric layer 112 may be a silicon oxide, silicon nitride, a high-k dielectric material, or multilayers thereof. A high-k dielectric material, such as a dielectric having a k value greater than about 7.0, may include or be a metal oxide or a silicate of Hf, Al, Zr, La, Mg, Ti, Y, Sc, Lu, Gd, Sr, Dy, Ca, Sm, or a combination thereof.

One or a plurality of metal liner layers 114 can be formed conformally over the gate dielectric layer 112. The metal liner layers 114 can include a capping layer, a barrier layer, and/or a work function tuning layer. A capping layer and a barrier layer can be used to prevent impurities from diffusing into or away from underlying layers. The capping layer and/or barrier layer may include tantalum nitride, titanium nitride, the like, or combinations thereof. A work function tuning layer can be chosen to tune the work function value so that a desired threshold voltage Vt is achieved in the transistor that is formed. Examples of a work function tuning layer include TaAl, TaN, TaAlC, TaC, TaCN, TaSiN, Ti, TiN, TiAlN, Ag, Mn, Zr, Ru, Mo, Al, WN, $ZrSi_2$, $MoSi_2$, $TaSi_2$, $NiSi_2$, other suitable work function materials, or a combination thereof.

A conductive gate fill 116 is formed over the optional metal liner layer 114 (if implemented) and/or the gate dielectric layer 112 and fills the trench. The conductive gate fill 116 may comprise a metal-containing material such as tungsten (W), cobalt (Co), ruthenium (Ru), aluminum (Al), titanium nitride (TiN), tantalum nitride (TaN), tantalum carbon (TaC), titanium aluminum nitride (AlTiN), titanium aluminum carbon (AlTiC), titanium aluminum oxide (AlTiO), a combination thereof, and multi-layers thereof.

Portions of the layers for the conductive gate fill 116, the optional metal liner layer 114, and the gate dielectric layer 112 above the top surfaces of the first ILD 100, the CESL 96, and the gate spacers 86 are removed, such as by a planarization process, like a CMP process.

The second ILD 130 is formed over the first ILD 100, the replacement gate structures 110, the gate spacers 86, and the CESL 96. Although not illustrated, in some examples, an etch stop layer may be deposited over the first ILD 100, etc., and the second ILD 130 may be deposited over the ESL. The second ILD 130 may comprise or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The second ILD 130 may be deposited by any acceptable deposition technique.

Openings through the second ILD 130, the first ILD 100, and the CESL 96 to the epitaxy source/drains 94 are formed to expose at least portions of the epitaxy source/drains 94, such as by using appropriate photolithography and one or more etch processes. Contacts 146 are formed in the openings to the epitaxy source/drains 94. The contacts 146 may include a fill metal, such as tungsten, aluminum, cobalt, ruthenium, copper, or other suitable metals. The contacts 146 may further include silicide on the respective source/drain 94 and a barrier and/or adhesion layer between the fill metal and sidewalls of the openings. In certain embodiments, more uniform height 94H of the source/drains 94 may provide better DC/AC performance of the semiconductor device 30, such as a FinFET device, due to more uniform formation of the contacts 146 to the source/drains 94.

Figure 10:
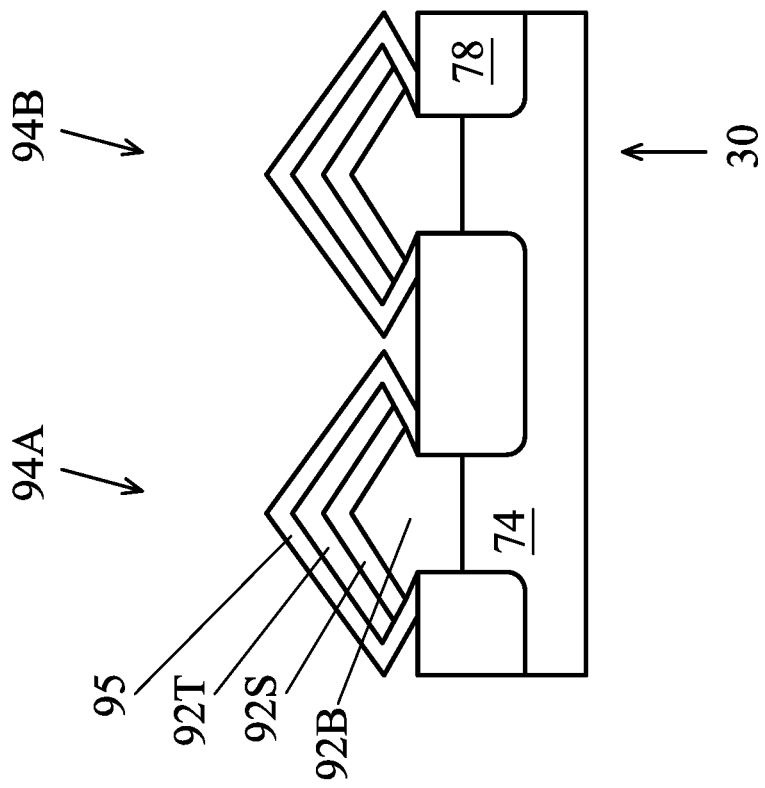
FIG. 10 illustrates unmerged source/drains, in accordance with some embodiments.

As shown in FIG. 9B, two neighboring source/drains 94 are formed as a merged source/drain. In other embodiments, the source/drains 94 may be formed as separate source/drains or as a partially merged source/drain. For example, two source/drains 94 are formed as an unmerged doped source/drain in FIG. 10. FIG. 10 is a schematic diagram of one stage of manufacturing a semiconductor device 30 through cross-section B-B of FIG. 1, in accordance with some embodiments. In the embodiment shown in FIG. 10, the bottom layer 92B, the supportive layer 92S, and the top layer 92T of the source/drain 94A are separate from the bottom layer 92B, the supportive layer 92S, and the top layer 92T of neighboring source/drain 94B. The capping layer 95 of source/drain 94A is also separate from the capping layer 95 of the neighboring source/drain 94B. In other embodiments, the neighboring source/drains 94A, 94B may be unmerged while the capping layer 95 is merged over the neighboring source/drains 94A, 94B.

Figure 11:
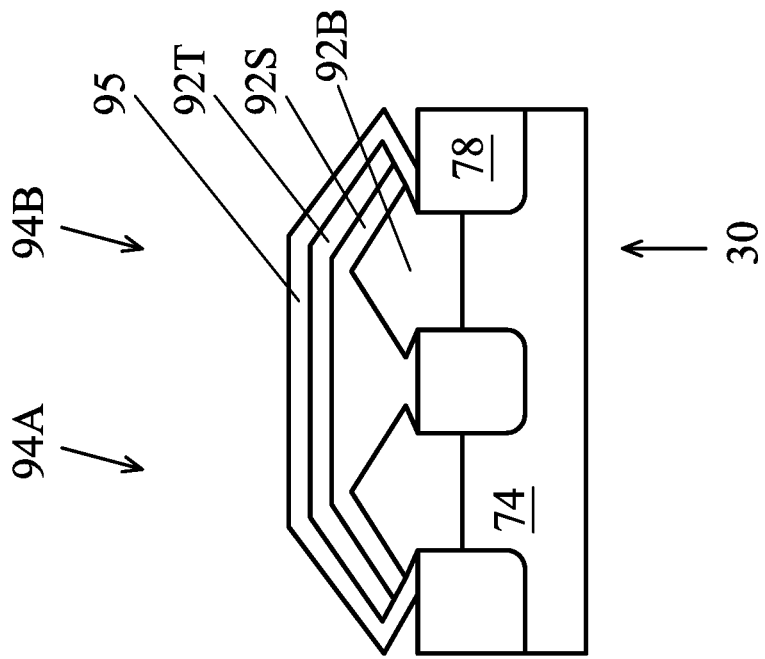
FIG. 11 illustrates partially merged source/drains, in accordance with some embodiments.

Two source/drains 94 may be formed as partially merged source/drains 94, as shown in FIG. 11. FIG. 11 is a schematic diagram of one stage of manufacturing a semiconductor device 30 through cross-section B-B of FIG. 1, in accordance with some embodiments. In the embodiment shown in FIG. 11, the bottom layer 92B is separate in neighboring source/drains 94. The supportive layer 92S and the top layer 92T of the source/drain 94A are merged with the supportive layer 92S and the top layer 92T of neighboring source/drains 94B. The capping layer 95 is merged over the neighboring source/drains 94A, 94B.

Figure 12:
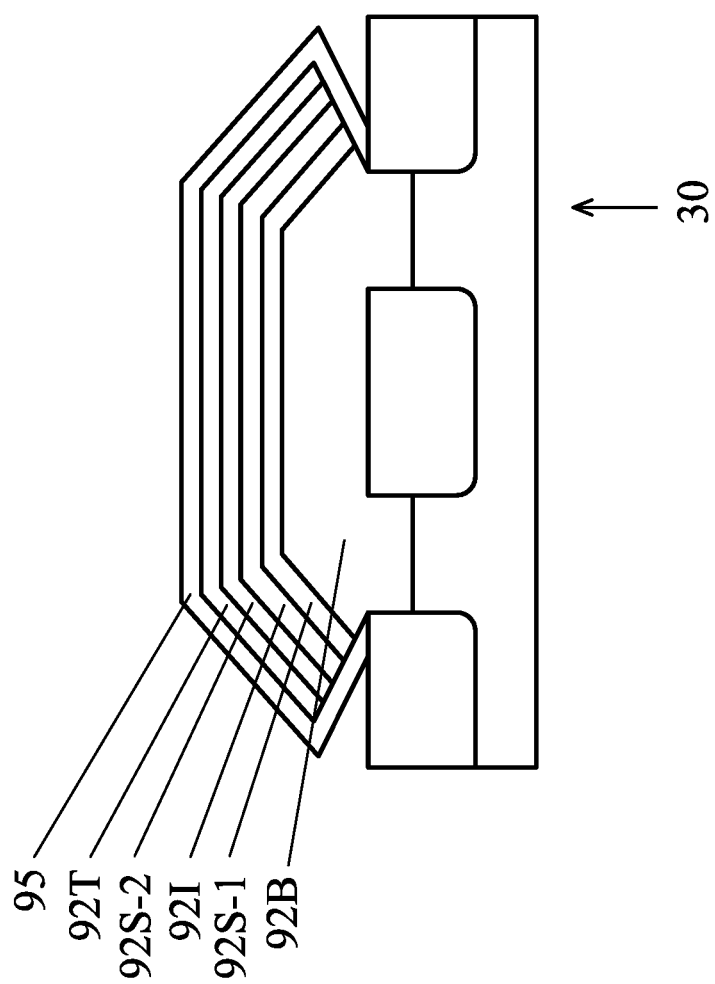
FIG. 12 illustrates supportive layers within the source/drains, in accordance with some embodiments.

In certain embodiments, a plurality of supportive layers 92S may be formed within the source/drains 94, as shown in FIG. 12. FIG. 12 is a schematic diagram of one stage of manufacturing a semiconductor device 30 through cross-section B-B of FIG. 1, in accordance with some embodiments. In the embodiment shown in FIG. 12, a bottom layer 92B is formed in the recesses 90 of FIGS. 5A and 5B. A first supportive layer 92S-1 is formed over the bottom layer 92B. An intermediate layer 92I is formed over the first supportive layer 92S-1. A second supportive layer 92S-2 is formed over the intermediate layer 92I. A top layer 92T is formed over the second supportive layer 92S-2. An optional capping layer 95 is formed over the top layer 92T. Although two supportive layers 92S-1 and 92S-2 and one intermediate layer 92I are shown in FIG. 12, the number and the thickness of the supportive layers 92S and the intermediate layers 92I can be selected based upon the desired shape of the source/drains 94. In certain embodiments, the plurality of supportive layers 92S number in a range from two layers to twenty layers.

In certain embodiments, the plurality of supportive layers 92S have one or more different properties than the bottom layer 92B, the one or more intermediate layers 92I, and the top layer 92T of the source/drains 94, such as a such as a different material, a different natural, relaxed lattice constant, a different dopant concentration, and/or a different alloy percent content.

In one example of a different material, the supportive layers 92S comprise p-doped silicon, undoped silicon, or undoped silicon germanium while the bottom layer 92B, the one or more intermediate layers 92I, and the top layer 92T comprise p-doped silicon germanium. In another example, the supportive layers 92S comprise arsenic doped silicon, arsenic doped silicon germanium, undoped silicon, or undoped silicon germanium while the bottom layer 92B, the one or more intermediate layers 92I, and the top layer 92T comprise phosphorus doped silicon. In still other instances, the supportive layers 92S comprise phosphorus doped silicon, phosphorus doped silicon germanium, undoped silicon, undoped silicon germanium while the bottom layer 92B, the one or more intermediate layers 92I, and the top layer 92T comprise arsenic doped silicon.

In one example of a different natural lattice constant, the supportive layers 92S comprise a p-doped silicon germanium having a different natural, relaxed lattice constant than the bottom layer 92B, the one or more intermediate layers 92I, and the top layer 92T comprising a p-doped silicon germanium.

In one example of a different dopant concentration, the supportive layers 92S comprise p-doped silicon germanium having a lower p-dopant concentration than the bottom layer 92B, the one or more intermediate layers 92I, and the top layer 92T comprising p-doped silicon germanium.

In one example of a different alloy percent content, the bottom layer 92B, the supportive layers 92S-1, 92S-2, the one or more intermediate layers 92I, and the top layer 92T all comprise doped SiGe in which the supportive layers 92S-1, 92S-2 comprise a germanium atomic percent content less than the bottom layer 92B, less than the one or more intermediate layers 92I, and less than the top layer 92T. In another example of a different alloy percent content, the bottom layer 92B, the supportive layers 92S-1, 92S-2, the one or more intermediate layers 92I, and the top layer 92T all comprise doped SiGe in which the supportive layers 92S-1, 92S-2 comprise a germanium atomic percent content less than the bottom layer 92B, in which the bottom layer 92B comprises a germanium atomic percent content less than the one or more intermediate layers 92I, and the one or more intermediate layers 92I comprise a germanium atomic percent content less than the top layer 92T.

In certain embodiments, each of the supportive layers 92S-1, 92S-2 provides less lattice dislocations from the top layer 92T to the intermediate layer 92I and from the intermediate layer 92I to the bottom layer 92B in comparison to a top layer 92T directly formed on the intermediate layer 92I directly formed on the bottom layer 92B. Since there are less lattice dislocations, greater strain can be transferred from the top layer 92T through the supportive layer 92S-2 to the intermediate layer 92I through the supportive layer 92S-1 to the bottom layer 92B to the fin 74 to form a strain channel device with greater strain transfer to the channel.

In certain embodiments, the plurality of supportive layers 92S may each have the same or may have different properties from each other. For example, the first supportive layer 92S-1 and the second supportive layer 92S-2 may comprise the same or a different material. For example, the first supportive layer 92S-1 and the second supportive layer 92S-2 may comprise the same or a different crystallinity. For example, the first supportive layer 92S-1 and the second supportive layer 92S-2 may comprise the same or a different dopant concentration.

As shown in FIGS. 9B and 10 through 12, the source/drains 94 may have various shapes. For example, one or more of the following aspects may contribute to the shape of the source/drains: the bottom surface of the recess 90; the lateral and vertical growth of the source/drains 94 in the recesses 90; the material of the supportive layer 92S; the thickness of the supportive layer 92S; the number of supportive layers 92S; the thickness of the bottom layer 92B and the top layer 92T; and the number and thickness of the intermediate layers 92I. While the source/drains discussed herein are fabricated using recessed fins, source/drains may be fabricated by forming source/drains over non-recessed fins.

It is understood that the semiconductor devices and methods of manufacture may also include additional layers, such as photoresist layers, mask layers, diffusion barrier layers, capping layers, silicide areas, etch stop layers, dielectric layers, adhesion layers, and the other suitable layers. It is understood that the substrate may include a plurality of features (doped regions or wells, fins, source/drain regions, isolation regions, shallow trench isolation (STI) feature, gate structures, interconnect lines, vias, and other suitable features) formed in, on, and/or over the substrate. The plurality of layers and/or features are used in the fabrication of semiconductor devices and integrated circuits. The substrate may also include additional materials formed in, on, and/or over the substrate in the blocks of the methods and in the figures as described herein. The semiconductor devices and methods may also include additional manufacturing processes including photoresist coating (e.g., spin-on coating), soft baking, mask aligning, exposure, post-exposure baking, developing the photoresist, rinsing, drying, hard baking, inspection, etching, planarization, chemical mechanical polishing (CMP), wet clean, ashing, and/or other applicable processes.

In certain embodiments, a p-type FinFET is described with a FinFET device formed over an n-well or with a FinFET device formed with p-type/p-doped source/drains. In is understood that the p-type FinFET devices may also be integrated with the formation of n-type FinFET devices.

Embodiments disclosed herein relate generally to forming one or more supportive layers within source/drains in a fin of a FinFET device. For example, the fin may have recesses formed therein in which source/drains are epitaxially grown. In certain embodiments, the supportive layer may help to enhance epitaxial growth of the source/drain. For example, the supportive layer may provide less lattice-mismatch and may provide less crystal dislocation for an epitaxial layer formed thereover which will have a smaller crystal defect density. Less crystal dislocations in the epitaxial layers over the supportive layer may lead to larger strain transferred from the source/drains to a channel formed by the fin of a FinFET device and defined by a gate structure over the fin. Less crystal dislocations may provide pseudomorphic growth of an epitaxial layer over the supportive layer with less relief of the stress within the epitaxially grown layer resulting in larger strain transferred to the channel. In certain embodiments, the supportive layer may help to control the uniformity and the shape of the source/drains. For example, the height of the source/drains may be more uniformly controlled leading to better DC/AC performance.

An embodiment is a semiconductor structure. The semiconductor structure includes a fin on a substrate. A gate structure is over the fin. A source/drain is in the fin proximate the gate structure. The source/drain includes a bottom layer, a supportive layer over the bottom layer, and a top layer over the supportive layer. The supportive layer has a different property than the bottom layer and the top layer, such as a different material, a different natural lattice constant, a different dopant concentration, and/or a different alloy percent content.

Another embodiment is a method of manufacturing a semiconductor device. The method includes forming a fin on a substrate. A gate structure is formed on the fin. Recesses are formed in the fin. A first source/drain is formed in one of the pluralities of recesses in the fin. The first source/drain includes a first bottom layer, a first supportive layer, and a first top layer. A second source/drain is formed in another one of the pluralities of recesses in the fin. The second source/drain includes a second bottom layer, a second supportive layer, and a second top layer. The first supportive layer and the second supportive layer have a different property than the first bottom layer, the first top layer, the second bottom layer, and the second top layer, such as a different material, a different natural lattice constant, a different dopant concentration, and/or a different alloy percent content.

Still another embodiment is a semiconductor structure. The semiconductor structure includes a fin on a substrate. A gate structure is over the fin. Source/drains are in the fin on opposing sides of the gate structure. The source/drains include a bottom layer, a plurality of supportive layers over the bottom layer, one or more intermediate layers between the plurality of supportive layers, and a top layer over the plurality of supportive layers. The plurality of supportive layers include silicon germanium with an atomic percent content of germanium less than the bottom layers, less than the one or more intermediate layers, and less than the top layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first fin over a substrate;
a gate structure on sidewalls and a top surface of the first fin;
a first source/drain region and a second source/drain region on opposing sides of the gate structure, each of the first source/drain region and the second source/drain region comprising:
a first semiconductor layer in the first fin;
a second semiconductor layer over the first semiconductor layer; and
a third semiconductor layer over the second semiconductor layer, wherein a first thickness of the first semiconductor layer and a third thickness of the third semiconductor layer are each greater than a second thickness of the second semiconductor layer, and wherein a material composition of the second semiconductor layer is different from material compositions of the first semiconductor layer and the third semiconductor layer; and
a source/drain contact electrically connected to the first source/drain region, wherein a bottom surface of the source/drain contact is disposed within the third semiconductor layer.

2. The semiconductor structure according to claim 1, wherein a thickness of the second semiconductor layer is in a range of 0.5 nm to 4 nm.

3. The semiconductor structure according to claim 1, wherein the second semiconductor layer comprises boron doped silicon, undoped silicon, or undoped silicon germanium, and wherein the first semiconductor layer and the third semiconductor layer each comprise boron doped silicon germanium.

4. The semiconductor structure according to claim 1, wherein the second semiconductor layer comprises arsenic doped silicon, arsenic doped silicon germanium, undoped silicon, or undoped silicon germanium, and wherein the first semiconductor layer and the third semiconductor layer each comprise phosphorus doped silicon.

5. The semiconductor structure according to claim 1, wherein the second semiconductor layer comprises phosphorus doped silicon, phosphorus doped silicon germanium, undoped silicon, or undoped silicon germanium, and wherein the first semiconductor layer and the third semiconductor layer each comprise arsenic doped silicon.

6. The semiconductor structure according to claim 1, wherein the second semiconductor layer has a different lattice content than each of the first semiconductor layer and the third semiconductor layer.

7. The semiconductor structure according to claim 1, wherein the second semiconductor layer has a different dopant concentration than each of the first semiconductor layer and the second semiconductor layer.

8. The semiconductor structure according to claim 1, wherein the second semiconductor layer has a lower p-type dopant concentration than each of the first semiconductor layer and the second semiconductor layer.

9. The semiconductor structure according to claim 1, wherein the second semiconductor layer has a different allow percent concentration than each of the first semiconductor layer and the second semiconductor layer.

10. The semiconductor structure according to claim 1, wherein the second semiconductor layer has a lower germanium atomic percent content than each of the first semiconductor layer and the second semiconductor layer.

11. The semiconductor structure according to claim 10, wherein the first semiconductor layer has a lower germanium atomic percent content than the second semiconductor layer.

12. A semiconductor structure comprising: a fin on a substrate;
a gate stack over a semiconductor fin;
a source/drain region in the fin and adjacent to the gate stack, the source/drain region comprising:
a bottom layer, wherein the bottom layer comprises a first semiconductor material;
a middle layer over the bottom layer, the middle layer comprising a second semiconductor material;
a top layer over the middle layer, the top layer comprising a third semiconductor material, wherein the middle layer has a different material property than the bottom layer and the top layer; and
a source/drain contact electrically connected to the source/drain region, wherein a bottom surface of the source/drain contact is disposed within the top layer.

13. The semiconductor structure of claim 12, wherein the bottom layer has a thickness in a range from 30 nm to 50 nm, and the top layer has a thickness in a range from 15 nm to 45 nm.

14. The semiconductor structure of claim 12, wherein the semiconductor fin comprises silicon germanium.

15. The semiconductor structure of claim 12 further comprising a cap layer over the top layer, wherein the cap layer comprises a fourth semiconductor material, and wherein the source/drain contact extends through the cap layer.

16. The semiconductor structure of claim 12, wherein the different material property is a different material, a different natural lattice constant, a different dopant concentration, or a different alloy percent content.

17. A semiconductor device, comprising:
a semiconductor fin;
a source/drain region extending into the semiconductor fin, the source/drain region comprising:
a bottom semiconductor layer;
a middle semiconductor layer over the bottom semiconductor layer, wherein a thickness of the middle semiconductor layer is in a range of 0.5 nm to 4 nm;
a top semiconductor layer over the middle semiconductor layer, wherein the middle semiconductor layer has a different material property than the bottom semiconductor layer and the top semiconductor layer; and
a capping layer over the top semiconductor layer; and
a source/drain contact extending through the capping layer to the top semiconductor layer.

18. The semiconductor device according to claim 17, wherein the different material property is a different material, a different natural lattice constant, a different dopant concentration, or a different alloy percent content.

19. The semiconductor device according to claim 18, wherein the bottom semiconductor layer and the top semiconductor layer each comprise silicon germanium.

20. The semiconductor device according to claim 18, wherein the semiconductor fin comprises silicon germanium.

* * * * *